United States Patent [19]

Pascal

[11] 4,300,078
[45] Nov. 10, 1981

[54] METHOD OF CONSTRUCTING MODELS OF ROTARY ELECTRICAL MACHINES TO PROVIDE SIMULTANEOUS SIMILITUDE OF ELECTROMAGNETIC, THERMAL AND MECHANICAL WORKING CONDITIONS OF THE ROTOR

[75] Inventor: Jean-Pierre Pascal, Paris, France

[73] Assignee: Institut de Recherche des Transports, France

[21] Appl. No.: 960,519

[22] Filed: Nov. 14, 1978

[30] Foreign Application Priority Data

Nov. 15, 1977 [FR] France ............................. 77 34305

[51] Int. Cl.³ ............................................. H02K 15/00
[52] U.S. Cl. ........................................ 318/49; 318/45; 318/161; 324/158 MG; 73/116
[58] Field of Search ................. 318/490, 161, 45–49, 318/737; 73/116, 136 R, 432 SP; 324/158 MG; 35/19 A, 13, 16; 310/40 MM; 322/99

[56] References Cited

U.S. PATENT DOCUMENTS

| 2,885,625 | 5/1959 | Pittman, Jr. ........................... 318/48 |
| 3,052,117 | 9/1962 | Miller et al. ................. 324/158 MG |
| 3,705,352 | 12/1972 | Restivo ...................... 324/158 MG |

OTHER PUBLICATIONS

Sudan et al., "The Measurement of Transient Torque and Load Anole in Model Synchronous Machines", Inst. Elec. Eng., Feb. 1960, pp. 51–60.

Mehta et al., "Transient Torque and Load Angle of a Synchronus Generator Following Several Types of System Disturbance", IEE Processing, 2–60, pp. 61–74, (G. Britian).

Chrisofides et al., "Determination of Load Losses and Torques in Squirrel-Cage Induction Motors", Proc. IEE, vol. 113, No. 12, 12–66, pp. 1995-2004.

Malik et al., "Study of Asynchronous Operation and Resynchronisation Synchronus Machines by Mathematical Models", Proc. IEE, vol. 113, No. 12, 12–66, (G. Britain).

Primary Examiner—David Smith, Jr.
Attorney, Agent, or Firm—Karl W. Flocks; A. Fred Starobin

[57] ABSTRACT

The method makes possible experimentation on reduced scale models, more especially in non-stationary operating conditions, of the rotor of rotary electrical machines respecting the physical conditions which ensure in the rotor under test a simultaneous similitude for the electromagnetic, thermal and mechanical phenomena. The contradiction which appears in the reduction of the electromagnetic forces and of the inertial forces is removed by modifying the stator of the reduced scale model so as to produce in the rotor a correct evolution of the rotor frequencies. The method is useful for testing rotors of very high power electrical machines.

4 Claims, 2 Drawing Figures 4,300,078

METHOD OF CONSTRUCTING MODELS OF ROTARY ELECTRICAL MACHINES TO PROVIDE SIMULTANEOUS SIMILITUDE OF ELECTROMAGNETIC, THERMAL AND MECHANICAL WORKING CONDITIONS OF THE ROTOR

FIELD OF THE INVENTION

The present invention relates to a method enabling the construction of reduced scale models making possible experimentation on the reduced scale, more especially in non-stationary conditions, of the rotor of very high power rotary electrical machines for which experimentation on a full scale is practically impossible and this respecting the physical conditions which ensure in the rotor under test a simultaneous simulation of the electromagnetic, thermal and mechanical phenomena.

More particularly, the method according to the invention enables the resolution, in a relatively simple and effective manner, of the concrete problem which is at present posed for the electrical industry.

DESCRIPTION OF THE PRIOR ART

For some years, the organization Electricite de France has tolerated and even used, for its own requirements in power generating stations, more and more powerful cage rotor asynchronous motors. These motors are particularly robust, once the critical starting-up phase is past. They are easy to maintain and their aptitude in service is characterized by their capacity to ensure a fairly high number of starts without damage to the rotor. This damage occurs in the cage when one or several sections, generally at the connection of the bars with the short circuit rings, are subject to too high a thrust at the end of the starting up. These stresses are of electrodynamic, thermal and centrifugal origin. If the electrodynamic forces tend to decrease toward the end of starting-up, the centrifugal and thermal stresses are on the other hand, at a maximum. With these motors, the periods of starting-up are short, since they are of the order of 5 to 10 seconds for large motors, so that heating of the rotor can be considered as adiabatic. Ventilation does not intervene due to the fact that if high temperature gradients are developed in the bars and the rings, their mechanical support, the stack of laminations, has remained cold.

These start-ups are mostly characterized by the placing in rotation of an inertia of which the rotor constitutes a large part. If it is known that the total energy dissipated in the cage during these start is equal to the kinetic energy acquired by the inertias, it is generally impossible, on the other hand, to provide with exactitude the thermal distribution corresponding to the end of starting up. In fact, to improve the characteristics, advantage is taken of the skin effect in the bars by forming deep notches to obtain high cage resistance to major slips, when the frequency of the rotor currents is high. Conventional hypotheses assume that these currents attenuate starting from the opening of the slot towards the bottom. If the slots are closed, as is now the case to simplify manufacture, in order to enable casting of the cages and better resistance to centrifugal forces, it becomes very difficult to accept, at least as regards the consecutive thermal gradients, the above hypothesis which assumes a tangential magnetic field in the slots. In the absence of the possibility of calculation of this thermal distribution it is no longer possible to calculate the stress field and the fatigue phenomena which can occur. One is consequently obliged to resort to experimentation with a sufficient number of starts before launching production.

However, the powers contemplated at present exceed 5000 HP and corresponding test benches are no longer available. Full scale experimentation is hence practically impossible and the risks of launching such machines become considerable.

This is why electricians have sought similitude methods enabling the construction of reduced scale models for experimentation.

In spite of the attraction of electromagnetic similitude method, the solutions proposed at the present time are not used by reason of the impossibility which occurs of removing the two following major difficulties:

the electromagnetic speeds are increased as the reduction in scale and the centrifugal stresses are hence increased as its square. Since these stresses are one of the premise data of the problem which has to be modelized, there is a contradiction;

the energies, and hence in particular the sum of the losses dissipated in the cage during starting-up, are reduced as the cube of the scale if all is considered. The mass being reduced in the same ratio, it is this condition which enables adiabatic heating to be preserved. However this condition can only be taken into account if the moment of inertia of the driven masses has been reduced as the power 7 of this scale; now the geometric reduction leads to the power 5. This signifies that at the scale $\frac{1}{3}$, currently used, a geometric reduction leads to inertia nine times too great. As there is no question of changing materials nor the forms of the rotor of the experimental model, it would be necessary that the external inertia, which has no need to be geometrically similar to the true magnitude, should represent at least eight times that of the rotor itself. It is here wherein the second difficulty resides that present solutions have not be able to resolve.

It is an object of the method according to the present invention, to permit the two major difficulties mentioned above to be resolved, and to provide the possibility of experimentation with the rotors of reduced scale models with practically complete reproduction of the stress field.

On the other hand, other simulations which are applied in present known solutions, resort to hypotheses which are difficult to check and lead to models of which the three dimensions are not reduced in the same manner.

GENERAL DESCRIPTION OF THE INVENTION

The method according to the present invention characterized by the fact that it consists of removing the contradiction which appears in the reduction of the electromagnetic forces and of the inertial forces by modifying the stator of the reduced scale model so as to produce in the rotor correct evolution of the rotor frequencies.

In a first embodiment of the method, the stator is made to rotate in reverse direction to the rotor and proportionally so that, at any moment, the relationship:

$$V_s = V_r(1 = e^{-1})$$

is found, in which:

$V_s$ is the stator speed;

$V_r$ is the rotor speed; and e is the geometric scale of reduction.

In a second embodiment of the method, in order to enable performances of simplified tests in which good simulation is sought by disregarding the winding harmonics of the motor, the stator is left immobile and there is used to start up the model under test, a rotary unit operating as an impulse alternator on its own inertia, which is adjusted by external flywheels so that the relationship:

$$J_a = \beta j \frac{e}{1-e} \times \left(\frac{4\pi\alpha}{n}\right)^2$$

is noted, in which:

$J_a$ is the moment of inertia of the alternator;

$\beta$ is a majorating coefficient, very little higher than unity, which takes into account stator losses;

j is the moment of inertia of the model rotor;

n is the number of poles of the model motor; and $\alpha$ is the constant ratio of the frequency of the alternator at its angular speed.

According to the present invention there is also provided specific means enabling the practising of the aforesaid method and the invention also provides the reduced models obtained by the application of said method.

Other features, advantages and particularities of the present invention will emerge from the description which follows with reference to the accompanying drawings showing, by way of non-limiting illustration, two possible test assemblies applying the method according to the invention.

DESCRIPTION OF PREFERRED EMBODIMENTS

In the remainder of the description, it is to be noted that to avoid any ambiguity, the capital letters relate to magnitudes of the prototype whilst the lower case letters relate to the same magnitudes of the reduced scale model.

Figure 1:
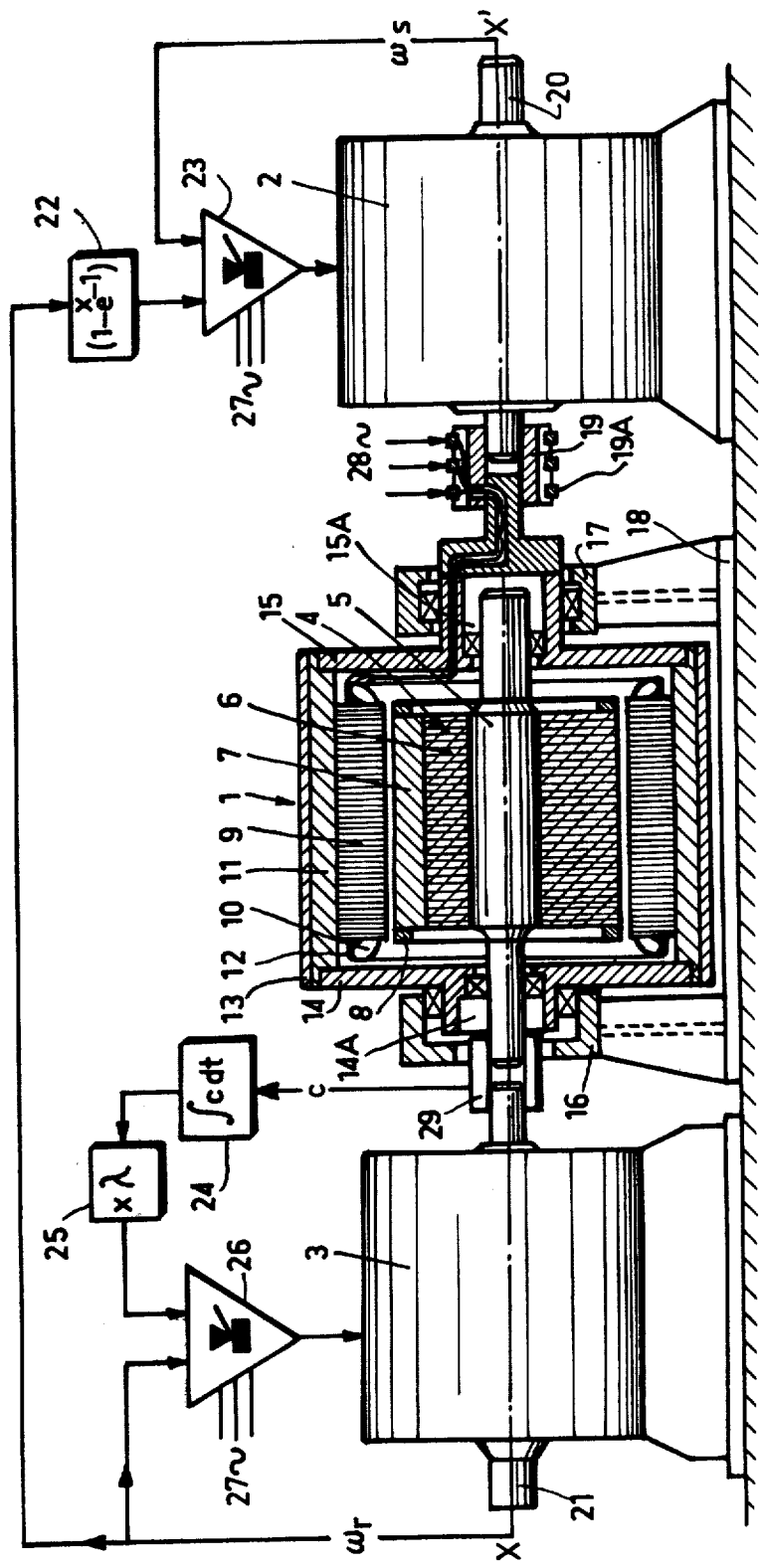
FIG. 1 is an assembly diagram of the means enabling the construction of a reduced scale model of a prototype asynchronous motor to be achieved, in which all the thermal, mechanical and electrical phenomena are similar to those of said prototype.

Referring to FIG. 1, the asynchronous motor under test, denoted by the general reference numeral 1, is the model on a reduced scale e of the prototype under study. This motor 1 is positioned on a base between two DC motors 2 and 3 which are designed to effect the necessary servocouplings for the realization of the correct simulation for the starting-up of the rotor under test denoted by the general reference numeral 4. This rotor is strictly similar to that of the prototype and pivoted through a shaft 5 in bearings 14A and 15A arranged in end plates 14 and 15.

The stack of laminations 6 is locked on the shaft 5 by a customary method; it includes deep slots receiving the bars 7 connected at the end to the rings 8.

In accordance with an essential feature of the method according to the invention, the "stator" of the motor 1 is arranged so as to be rotatable around the common axis XX' of the machines 2, 1, 3 through bearings 16 and 17. This stator includes: a stack of laminations 9 containing the windings 10 in slots; a tubular frame 11 bound by a hoop of prestressed fibers 13; and end plates 14 and 15. In addition, the coil heads are bound by the windings 12.

This "stator" is connected in rotation to the motor 2 by means of a coupling 19 bearing rings 19A, for the input of three phase current, which are connected to a fixed frequency source 28, which is increased in the ratio $e^{-2}$ times with respect to the fixed supply frequency of the prototype.

Thus if the scale of reduction $e = \frac{1}{3}$ and the prototype operates at a frequency of 50 Hz, the source 28 will have a frequency of 450 Hz.

A speed pick-up 20 keyed to the shaft of the motor 2 provides an electrical signal proportional to the angular speed $\omega_s$ of the "stator".

In addition, the shaft 5 of the rotor 4 is connected in rotation with the shaft of the motor 3 by means of a coupling 29 including conventional elements sensitive to the traversing torque c and supplying an electrical signal proportional to this traversing torque.

A speed pick-up 21 keyed to the shaft of the motor 3 provides an electrical signal proportional to the angular speed $\omega_r$ of the rotor 4.

The motor 2 is fed through a thyristor amplifier 23 connected to the mains 27 and controlled by signals proportional to the angular speed $\omega_s$ of the stator and $\omega_r$ of the rotor so that at any moment the relationship:

$$\omega_s = (1 - e^{-1})\omega_r$$

is realized.

A standard unit 22 provides the multiplication applied to $\omega_r$.

In addition, the motor 3 is supplied via a thyristor amplifier 26 connected to the mains 27 and controlled by the signals proportional to the traversing torques c and to the angular speed of the rotor $\omega_r$ so that at any moment there is realized the relationship:

$$\omega_r = \lambda \int_o^t c\, dt$$

A standard unit 25 effects the multiplication by $\lambda$ and a standard unit 24 effects the integration of c.

It is to be noted that this servocoupling to the motor 3 is equivalent to a moment of inertia of value $\lambda^{-1}$.

Viewed from the rotor 4, whose moment of inertia is $j_r$, all occurs as if a moment of inertia $\lambda^{-1}$ was coupled to it and as if the total inertia j of the shaft system of the rotor 4 were equal to:

$$j = j_r + \lambda^{-1}.$$

In order that the similitude be correct, it is necessary to have the relationship:

$$j = (J_R + J_{EX})e^6 = Je^6$$

in which $J_R$ is the moment of inertia of the rotor of the prototype and $J_{EX}$ the moment of the driven external inertias.

The geometric reduction results in:

$$j_r = J_R e^5$$

and hence the modulus 25 is determined by the equation:

$$\lambda^{-1} = J_R e^5(e-1) + J_{EX} e^6$$

As a result:

(a) if $J_{EX} < J_R(e^{-1}-1), \lambda^{-1}$ is negative and the motor 3 is indispensable;

(b) if $J_{EX} = J_R(e^{-1}-1), \lambda^{-1} = 0$ and the motor 3 can be eliminated completely;

(c) if $J_{EX} > J_R(e^{-1}-1), \lambda^{-1}$ is positive and the motor 3 can be replaced by a passive flywheel.

On the scale of reduction $e = \frac{1}{4}$, the limit is situated for $J_{EX} = 2 J_R$.

The starting-up test proper consists of connecting the fixed frequency and voltage source 28 to the collector 19 whilst all the machinery is at rest. An electromagnetic torque $C_m$ then appears between the rotor and the stator of the motor 1 under test so that the rotor takes up the speed according to the equation:

$$C_m = j(d/dt)\omega_r$$

while the stator is driven in reverse direction and it is forced through the effect of the motor 2 to follow the relationship:

$$\omega_s = (1 - e^{-1})\omega_r$$

The acceleration of the machines continues until the torque $C_m$ becomes nil, that is to say the rotor rotates at the speed of the slipping field.

If $\omega_c$ is the speed of the slipping field in the stator at rest ($\omega_c = \Omega c e^{-2}$ is imposed), with respect to the laboratory the field slips at the speed $\omega = \omega_c + \omega_s$ when the stator rotates at speed $\omega_s$. The synchronization speed is hence obtained for:

$$\omega_r = \omega_c + \omega_s$$

which amounts therefore to $\omega_{r\ max} = \Omega c e^{-1}$, which corresponds well to the conservation of the linear speeds of the rotors of the model and of the prototype and hence also to the same centrifugal stresses.

This servocoupling hence results in the relationship $\omega_r = \Omega_r e^{-1}$ for the limits of the speeds.

The prototype obeys the mechanical relationship:

$$dT = (J/C_m) d \Omega_r$$

and the model the relationship:

$$dt = (j/c_m) d \omega_r$$

now the similitude imposes at any moment, $c_m = C_m e^3$ and $t = Te^2$. It is indeed observed that if $j = Je^6$, which has been guaranteed by the servo control of the motor 3, the law of the speeds will be permanently:

$$\omega_r = \Omega_r e^{-1}.$$

The starting-up law of the model rotor is hence indeed similar to that of the prototype and the application of the invention enables the production in the model rotor of all the thermal, mechanical and electrical phenomena of the prototype so that such starting-up enables the behaviour of the materials of the rotor as regards fatigue to be studied.

As can be seen, the method according to the invention consisting of rotating the stator of the model in reverse direction to the rotor and proportionally, completely resolves the first difficulty which was pointed out above regarding the centrifugal forces in the rotor and very appreciably attenuates the second difficulty previously mentioned regarding the external inertias.

As has just been shown in fact, good similitude is again possible for the cases where, on the conventional scale of $\frac{1}{4}$, it suffices for the external inertias to represent at least twice (instead of eight times) that of the rotor.

From a practical point of view, it is indisputable that the fact of introducing centrifugal stresses into the "stator" is not troublesome, to the extent that the external hoops 12 and 13 are sufficient to resist the tests, considering that these stresses do not influence the electromagnetic operation.

Such a stator is obviously more laborious to construct than that of a conventional stator but it enables, on the other hand, tests of several different model rotors to be conducted, which was then impossible for the reasons previously explained.

Figure 2:
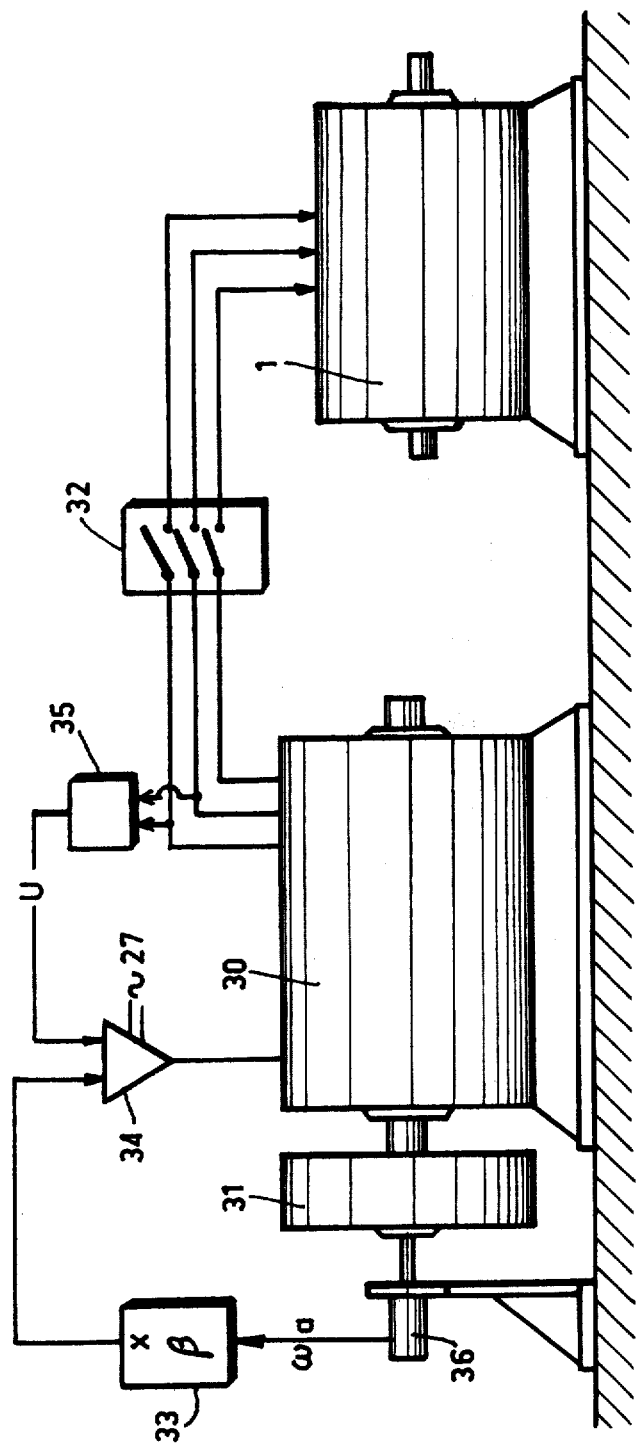
FIG. 2 is a simplified assembly diagram of the means enabling the construction of a reduced scale model of an asynchronous motor to be achieved, in which the modelization of the winding harmonics of the motor is disregarded.

Reference will now be made to the simplified test diagram shown in FIG. 2 which enables the achievement here again of good similitude for the starting-up of the rotor of the model motor, by disregarding however, this time, the modelization of the winding harmonics of the motor.

In accordance with this assembly, the motor 1, modeled on the scale e is normally constituted by a stator fixed to the frame and a rotor under study.

For simplification, it will be assumed that the moment of inertia j of this rotor fulfills exactly the similitude condition:

$$j = Je^6$$

in which J is the moment of inertia of the shaft assembly of the prototype.

In accordance with the method according to the invention, the motor 1 is, in this case, connected to an alternator 30 through a contactor 32.

A speed pick-up 36 fixed to the shaft of the alternator enables an electrical signal proportional to the frequency f of the alternator to be supplied whose voltage U can be kept at a constant ratio to f, through an amplifier 34 supplied by the mains 27.

The moment of inertia of the alternator 30 is adjusted to the value $J_a$ by means of a flywheel 31 keyed to the shaft of the alternator.

The initial speed of the alternator 30 is obtained by a starting motor (not shown).

If one takes $f = \alpha \omega_a$, where $\omega_a$ is the angular speed of the alternator, if its initial speed $\omega_a$ is selected such that $f_i = Fe^{-2} = \alpha \Omega_a$, where F is the frequency of the prototype and if n is the number of poles of the motor, $J_a$ is selected to have the relationship:

$$J_a = \beta j \frac{e}{1-e} \times \left(\frac{4\pi\alpha}{n}\right)^2$$

in which:
- $J_a$ is the moment of inertia of the alternator;
- $\beta$ is the majoring coefficient, very little higher than 1, which takes into account the stator losses of the two machines;
- j is the moment of inertia of the model rotor;
- n is the number of poles of the model motor; and
- α is the constant ratio of the frequency of the alternator to its angular speed.

The test consists, after having started the alternator at the speed $\Omega_a$, of closing the contactor 32 and allowing the starting-up to occur whilst the alternator operates at its own inertia without external contribution.

In this way, save for the stator losses, the kinetic energy of the alternator supplies that of the rotor of the motor plus its losses so that everything occurs for this rotor in the same way as in the full test of FIG. 1.

Equilibrium is reached for:

$$\omega_a = \Omega_a e \text{ and } \omega_r = \frac{4\pi a e \Omega_a}{n}$$

In other words, it is seen therefore that indeed the inertia $J_a$ of the alternator, enabling it to operate as a impulse alternator, is adjusted by the external flywheel 31 in such a way that, the initial speed of said alternator being that which supplies the correct frequency (for example 450 Hz for the conventional reduction scale $e = \frac{1}{3}$), the final speed is that which supplies the frequency at which the synchronizing speed of the rotor under test is just the right speed for the centrifugal forces (150 Hz in this case).

This test is not expensive considering that the alternator is necessary in any event; it has in addition the advantage of not requiring high installed network power.

Seen from the rotor, all occurs as in the actual case for the fundamental wave of the field.

On the other hand, the slots of the stator not rotating at the right speed opposite the rotor, it is appropriate for full safety to disregard, in the event, the modelization of the winding harmonics of the motor.

It is of course understood that the present invention has only been described and illustrated by way of preferential example and that equivalents could be introduced into its constituent elements without however departing from the scope of said invention, which is as defined in the appended claims.

I claim:

1. Method of producing the electromagnetic, thermal, and mechanical phenomena of the stress field of the rotor of a rotary electrical machine on a reduced scale model of that machine comprising the steps of
    building a reduced scale model of the rotor to be tested along with a reduced scale model of the stator,
    modifying the stator while building it to provide a correct evolution of rotor frequencies by compensation in the stator for reduction of electromagnetic and inertial forces in the rotor,
    connecting the motor consisting of said model rotor and stator under test to a rotary machine,
    obtaining a speed pick-up from said rotary machine and using said speed pick-up to control rotation frequency of said rotary machine,
    the stator being made to rotate in reverse direction to the rotor and proportionally so as to operate, at any moment, in accordance with the relationship:

$$V_s = V_r(1 - e^{-1})$$

in which:
- $V_s$ is the stator speed;
- $V_r$ is the rotor speed; and
- e is the geometrical scale of reduction.

2. Method of reproducing the electromagnetic, thermal, and mechanical phenomena of the stress field of the rotor of a rotary electrical machine on a reduced scale model of that machine comprising the steps of
    building a reduced scale model of the rotor to be tested along with a reduced scale model of the stator,
    modifying the stator while building it to provide a correct evolution of rotor frequencies by compensation in the stator for reduction of electromagnetic and inertial forces in the rotor,
    connecting the motor consisting of said model rotor and stator under test to a rotary machine,
    obtaining a speed pick-up from said rotary machine and using said speed pick-up to control rotation frequency of said rotary machine,
    leaving the stator stationary and starting up the model under test by using said rotary machine which is a rotary unit operating as an impulse alternator on its own inertia in order to enable simplified tests in which a good similitude is sought with disregard of the winding harmonies of the motor and which is adjusted by external flywheels so that the relationship:

$$J_a = \beta j \frac{e}{1-e} \times \frac{4\pi a}{n}^2$$

is fulfilled in which:
- $J_a$ is the moment of inertia of the alternator;
- $\beta$ is a majorifying coefficient, very slightly higher than unity, which takes into account stator losses;
- j is the moment of inertia of the model rotor;
- n is the number of poles of the model rotor; and α is the constant ratio of the frequency of the alternator to its angular speed.

3. Means for applying the method according to claim 2 comprising: a model motor connected to an alternator, an external flywheel connected to said alternator enabling adjustment of its own inertia; and a starting motor bringing said alternator to its initial speed so that the relationship:

$$J_a = \beta j \frac{e}{1-e} \times \frac{4\pi a}{n}^2$$

is used, in which:
- $J_a$ is the moment of inertia of the alternator;
- $\beta$ is a majorifying coefficient, very little higher than unity, which takes into account stator losses;
- j is the moment of inertia of the model motor;
- n is the number of poles of the model motor; and
- α is the constant ratio of the frequency of the alternator to its angular speed.

4. Means for reproducing the electromagnetic, thermal, and mechanical phenomena of the stress field of the rotor of a rotary electrical machine on a reduced scale model of that machine comprising
    a reduced scale model having a rotor, and said model also having a stator mounted on bearings;

said stator built in modified form to provide a correct evolution of the frequencies of said rotor by compensation in said stator for reduction of electromagnetic and inertial focus in said rotor;

electric motor means to rotate said rotor and to rotate said stator;

a servocoupling system between said stator and said rotor arranged so that when said rotor is rotated in one direction, said stator is automatically rotated in the reverse direction so that, at any moment, the relationship:

$$\omega_s = (1 - e^{-1})\omega_r$$

is fulfilled, in which:
- $\omega_s$ is the angular speed of the stator;
- $\omega_r$ is the angular speed of the rotor; and
- e is the geometric scale of reduction;

said servocoupling system including means to obtain a speed pick-up from said electric motor means and use said speed pick-up to control rotation frequency of said electric motor means.

* * * * *